(12) United States Patent
Wang et al.

(10) Patent No.: US 12,476,150 B2
(45) Date of Patent: Nov. 18, 2025

(54) CRITICAL DIMENSION UNIFORMITY (CDU) CONTROL METHOD AND SEMICONDUCTOR SUBSTRATE PROCESSING SYSTEM

(71) Applicant: Taiwan Semiconductor Manufacturing Company, Ltd., Hsinchu (TW)

(72) Inventors: Hsin-Chih Wang, Zhubei (TW); Yu-Tien Shen, Tainan (TW); Yu-Tse Lai, Zhubei (TW); Chih-Kai Yang, Taipei (TW); Hsiang-Ming Chang, Hsinchu (TW); Chun-Yen Chang, Hsinchu (TW); Ya-Hui Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 991 days.

(21) Appl. No.: 17/568,176

(22) Filed: Jan. 4, 2022

(65) Prior Publication Data
US 2023/0023152 A1 Jan. 26, 2023

Related U.S. Application Data

(60) Provisional application No. 63/224,909, filed on Jul. 23, 2021.

(51) Int. Cl.
*H01L 21/66* (2006.01)

(52) U.S. Cl.
CPC .............. *H01L 22/12* (2013.01); *H01L 22/26* (2013.01)

(58) Field of Classification Search
None
See application file for complete search history.

(56) References Cited

U.S. PATENT DOCUMENTS

2023/0023152 A1* 1/2023 Wang ..................... H01L 22/12

* cited by examiner

*Primary Examiner* — Jack S Chen
(74) *Attorney, Agent, or Firm* — McClure, Qualey & Rodack, LLP

(57) ABSTRACT

A critical dimension uniformity control method is provided. The method includes gathering a first CDU by a first critical dimension from a first wafer after being processed by a first surface process. The method includes determining a first calibration process based on the first CDU. The determining includes an intra dose correction step for correcting reticle-dependent deviation, a thru-slit dose sensitivity correction step for correcting time-dependent deviation, and an inter dose correction step for correcting process-dependent deviation. The method includes calibrating the first surface process by the first calibration process to determine a second surface process different from the first surface process.

20 Claims, 20 Drawing Sheets

204

CRITICAL DIMENSION UNIFORMITY (CDU) CONTROL METHOD AND SEMICONDUCTOR SUBSTRATE PROCESSING SYSTEM

PRIORITY CLAIM AND CROSS-REFERENCE

This application claims the benefit of U.S. Provisional Application No. 63/224,909, filed on 2021 Jul. 23, the entirety of which is incorporated by reference herein.

BACKGROUND

In the manufacturing of integrated circuits, patterning techniques such as photolithography and etching are used to form various features such as polysilicon lines, devices (e.g., transistors, diodes, and the like), interconnect structures, contact pads, and the like in device dies on a wafer. As design features in integrated circuits become increasingly complex (e.g., having smaller critical dimensions and/or more complex shapes), double patterning processes may be used to form a single feature. However, due to process limitations, critical dimensions of the various patterned features may not be uniform within a device die/wafer, which may degrade the performance of the device die/wafer.

In order to improve critical dimension uniformity (CDU) and within wafer (WiW) uniformity, dose mapper (DoMa) maps may be calculated for wafers to measure the actual critical dimensions of patterned features. These DoMa maps may then be used to adjust lithography conditions of the patterning process to improve CDU and WiW uniformity. However, conventional DoMa maps and applications thereof may suffer from various limitations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
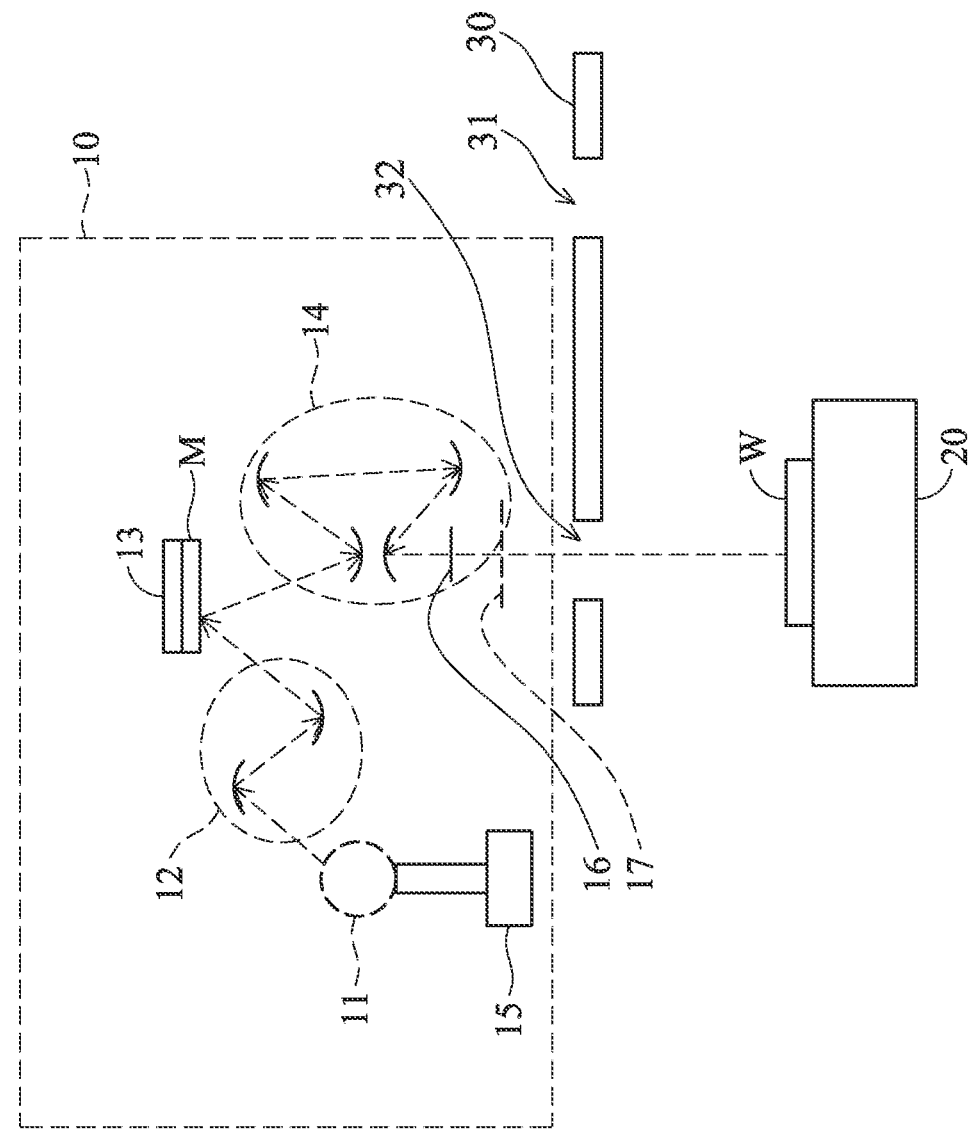
FIG. 1 is a schematic view of a semiconductor substrate processing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the minimum feature size of semiconductor integrated circuits (ICs) has continued to shrink, there has continued to be a great interest in photolithography systems and processes using radiation sources with shorter wavelengths. In view of this, extreme ultraviolet (EUV) radiation sources, processes, and systems have been introduced. The critical dimension uniformity (CDU) of a critical layer processed by EUV is variable with time and used tools. Uncertainty of CDU variation impact process window directly, so it is important to calibrate the EUV process for CDU maintenance. However, current calibration method is time-consuming, which reduces the yield.

Therefore, embodiments of a profile calibration method are provided. In some embodiments, the method includes an intra dose correction step for correcting reticle-dependent deviation, a thru-slit dose sensitivity correction step for correcting time-dependent deviation, and an inter dose correction step for correcting process-dependent deviation. As a result, required time of the calibration procedure can be reduced. Furthermore, the results can be recycled to further minimize critical dimension uncertainty.

FIG. 1 is a schematic view of a semiconductor substrate processing system 1, in accordance with some embodiments. In some embodiments, the semiconductor substrate processing system 1 includes a light source 10, a semiconductor substrate stage 20, and a heat shield 30. The elements of the semiconductor substrate processing system 1 can be added or omitted, and the disclosure should not be limited by the embodiments.

In some embodiments, the semiconductor substrate processing system 1 is a lithography system. The lithography system may also be generically referred to as a scanner that is operable to perform lithography exposing processes with respective radiation source and exposure mode. In some embodiments, the semiconductor substrate processing system 1 is an EUV lithography system designed to expose a resist layer by EUV light (for illustration, the semiconductor substrate processing system 1 is also referred to as an EUV lithography system 1). The resist layer is a suitable material sensitive to EUV light. The light source 10 of the EUV lithography system 1 employs the radiation source 11 to generate EUV light, such as EUV light having a wavelength ranging between about 1 nm and about 100 nm. In one particular example, the radiation source 11 generates EUV light with a wavelength centered at about 13.5 nm. Accordingly, the radiation source 11 is also referred to as a EUV radiation source 11. In some embodiments, the EUV radiation source 11 utilizes a mechanism of laser-produced plasma (LPP) to generate the EUV radiation. In some embodiments, the radiation source 11 also includes a collector, which may be used to collect EUV light generated from the plasma source and to direct the EUV light toward imaging optics such as an illumination module 12 described later.

The light source 10 of the EUV lithography system 1 also employs an illumination module 12. In various embodiments, the illumination module 12 includes various reflective optics, such as a single mirror or a mirror system having multiple mirrors, in order to direct light from the radiation source 11 onto a reticle M of the EUV lithography system 1, particularly to the reticle M secured on the reticle stage 13.

In some examples, the illumination module 12 may include a zone plate to improve the focus of the EUV light. In some embodiments, the illumination module 12 may be configured to shape the EUV light that passes through it into a particular pupil shape. Examples of pupil shapes include a dipole shape, a quadrapole shape, an annular shape, a single beam shape, a multiple beam shape, and combinations thereof. In some embodiments, the illumination module 12 is operable to configure the mirrors (i.e., of the illumination module 12) to provide the desired illumination to the reticle M. In one example, the mirrors of the illumination module 12 are configurable to reflect EUV light to different illumination positions. In some embodiments, a stage prior to the illumination module 12 may include other configurable mirrors that may be used to direct the EUV light to different illumination positions within the mirrors of the illumination module 12. In some embodiments, the illumination module 12 is configured to provide an on-axis illumination (ONI) to the reticle M. In some embodiments, the illumination module 12 is configured to provide an off-axis illumination (OAI) to the reticle M. It should be noted that the optics employed in the EUV lithography system 1, and in particular the optics used for the illumination module 12 and the projection optics module 14, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

The reticle stage 13 is configured to secure the reticle M. In some embodiments, since the EUV lithography system 1 may be housed in, and thus operate within, a high-vacuum environment, the reticle stage 13 includes an electrostatic chuck (e-chuck) to secure the reticle M. This is because gas molecules absorb EUV light and the lithography system used for EUV lithography patterning is maintained in a vacuum environment to avoid EUV intensity loss. In the present disclosure, the terms mask, photomask, and reticle are used interchangeably.

In some embodiments, the reticle M is a reflective mask. One exemplary structure of the reticle M includes a substrate made of a suitable material, such as a low thermal expansion material (LTEM) or fused quartz. In various examples, the LTEM includes $TiO_2$ doped $SiO_2$, or another suitable material with low thermal expansion. The reticle M includes reflective multiple layers (ML) deposited on the substrate. For example, the ML may include a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The reticle M may further include a capping layer, such as ruthenium (Ru), disposed on the ML for protection. The reticle M further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

As shown in FIG. 1, in the EUV lithography system 1, the reflective reticle M is held by the reticle stage 13 so that the patterned surface of the reticle M faces downward and the chucked surface of the reticle M (which is opposite the patterned surface) faces the reticle stage 13.

The light source 10 of the EUV lithography system 1 also includes a projection optics module (or projection optics box (POB)) 14 for imaging the pattern of the reticle M onto a semiconductor substrate W secured on the semiconductor substrate stage 20 of the EUV lithography system 1. In some embodiments, the projection optics module 14 has reflective optics for projecting the EUV light. The EUV light directed from the reticle M, which carries the image of the pattern defined on the reticle M, is collected by the projection optics module 14. The illumination module 12 and the projection optics module 14 are collectively referred to an optical module of the EUV lithography system 1.

In some embodiments, the EUV lithography system 1 may further include other modules or be integrated with (or be coupled with) other modules. For example, the EUV lithography system 1 also includes a gas supply module 15 designed to provide hydrogen gas (H₂) to the radiation source 11. The hydrogen gas helps reduce contamination in the radiation source 11. The elements of the EUV lithography system 1 can be added or omitted, and the disclosure should not be limited by the embodiments.

In some embodiments, the EUV lithography system 1 also includes a pupil phase modulator 16 to modulate the optical phase of the EUV light directed from the reticle M in such a way that the light has a phase distribution along a projection pupil plane 17. In some embodiments, the pupil phase modulator 16 includes a mechanism to tune the reflective mirrors of the projection optics module 14 for phase modulation. For example, in some embodiments, the mirrors of the projection optics module 14 are configurable to reflect the EUV light through the pupil phase modulator 16, thereby modulating the phase of the light through the projection optics module 14. In some embodiments, the pupil phase modulator 16 utilizes a pupil filter placed on the projection pupil plane 17. By way of example, the pupil filter may be employed to filter out specific spatial frequency components of the EUV light reflected from the reticle M. In some embodiments, the pupil filter may serve as a phase pupil filter that modulates the phase distribution of the light directed through the projection optics module 14.

In some embodiments, the semiconductor substrate W is a semiconductor wafer made of silicon or other semiconductor materials. Alternatively or additionally, the semiconductor substrate W may include other elementary semiconductor materials such as germanium (Ge). In some embodiments, the semiconductor substrate W is made of a compound semiconductor such as silicon carbide (SiC), gallium arsenic (GaAs), indium arsenide (InAs), or indium phosphide (InP). In some embodiments, the semiconductor substrate W is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor substrate W may be a silicon-on-insulator (SOI) or a germanium-on-insulator (GOI) substrate.

In addition, the semiconductor substrate W may have various device elements. Examples of device elements that are formed in the semiconductor substrate W include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the semiconductor substrate W is coated with a resist layer sensitive to the EUV light. Various components of the EUV lithography system 40 including those described above are integrated together and are operable to perform the lithography process. In some embodiments, the resist layer may have stringent performance standards. For purposes of illustration, an EUV resist may be designed to provide at least around 22 nm resolution, at least around 2 nm line-width roughness (LWR), and with a sensitivity of at least around 15 mJ/cm².

In some embodiments, a heat shield 30 is provided between the light source 10 and the semiconductor substrate stage 20 to block the heat generated from the light source 10. In some embodiments, a first channel 31 and a second channel 32 are formed on the heat shield 30 to allow light generated by the light source 10 to reach the semiconductor substrate W. In some embodiments, the semiconductor substrate W is initially moved to a first position under the first channel 31 by the semiconductor substrate stage 20 so that a position sensor, for example, can check whether the semiconductor substrate W is in the right position on the semiconductor substrate stage 20 through the first channel 31. Afterwards, the semiconductor substrate W is moved to a second position under the second channel 32 by the semiconductor substrate stage 20, and the light generated by the light source 10 may pass through the second channel 32 to reach the semiconductor substrate W.

Persons with ordinary skill in the art will understand that the EUV lithography system 1 may be also equipped with a plurality of pressure gauges, thickness monitor systems (quartz crystal monitor, spectroscopic ellipsometer, reflection high-energy electron diffraction detector (RHEED)), shutters, a rotational manipulator, viewports, and/or transfer ports, though these are not shown in the figure.

Figure 2:
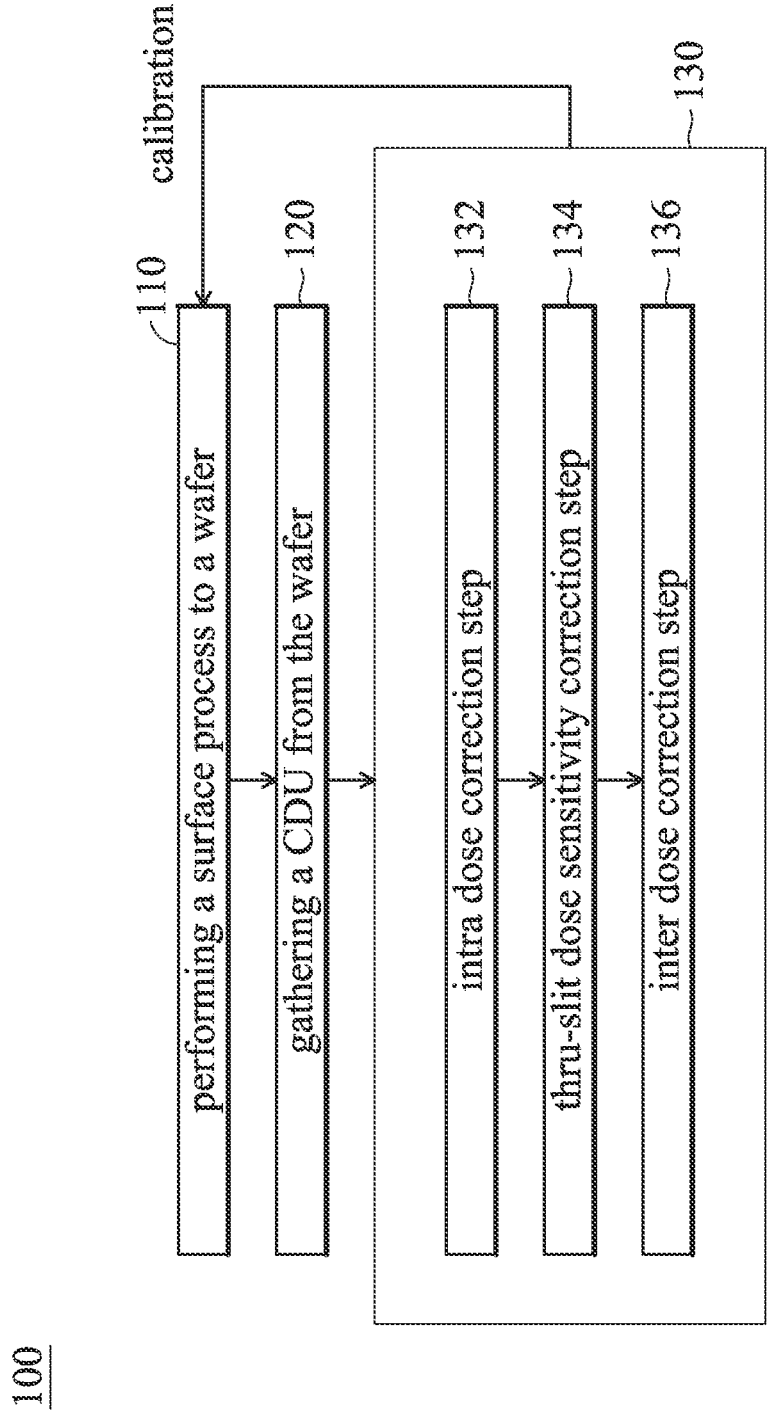
FIG. 2 shows a critical dimension uniformity control method for calibrating the error during the process, in accordance with some embodiments.

Since the critical dimension uniformity (CDU) of the semiconductor substrate W varies by time, and the used tools and the process also affects the critical dimension uniformity, it is desired to calibrate the critical dimension uniformity for enhancing the yield. FIG. 2 shows a critical dimension uniformity control method 100 for calibrating the error during the process, in accordance with some embodiments. In some embodiments, the critical dimension uniformity control method 100 includes a step 110 for performing a first surface process to a first wafer (e.g. the semiconductor substrate W), a step 120 for gathering a first CDU from the first wafer, and a step 130 for determining a first calibration process based on the first CDU. In some embodiments, the critical dimension uniformity control method 100 is performed by a computer.

Figure 3A:
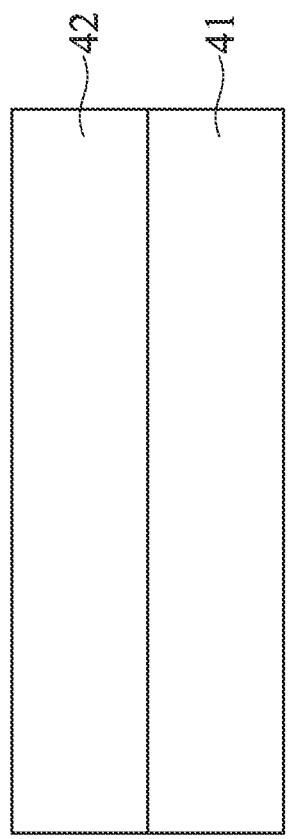
FIG. 3A to FIG. 3C shows an example of the step for performing the first surface process to the first wafer in FIG. 2, in accordance with some embodiments of the present disclosure.
Figure 3B:
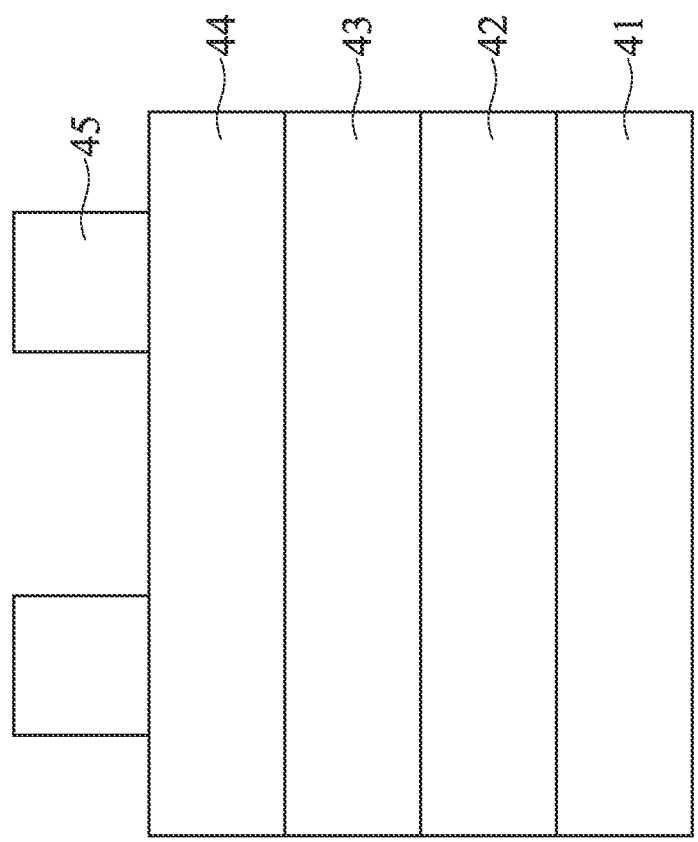
Figure 3C:
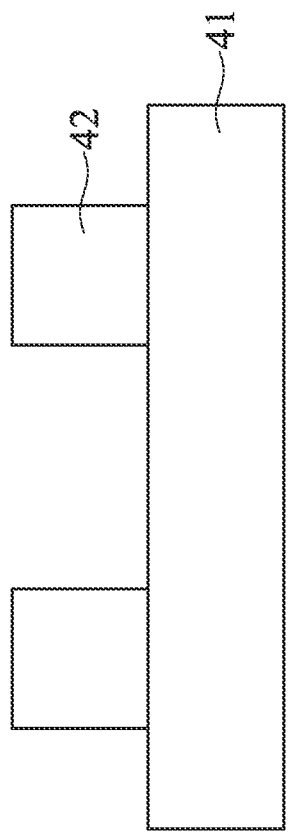

FIG. 3A to FIG. 3C shows an example of the step 110 for performing the first surface process to the first wafer in FIG. 2, in accordance with some embodiments of the present disclosure. It should be noted that other processes that applied to the surface of the semiconductor substrate W are also included in the step 110, in accordance with some embodiments of the present disclosure. As shown in FIG. 3A, a hard mask 42 is provided on a device layer 41, in accordance with some embodiments of the present disclosure. In some embodiments, the device layer 41 may be a polysilicon layer disposed over a substrate (not shown) for the formation of one or more polysilicon gates in semiconductor substrate W. The substrate may be a bulk silicon substrate although other semiconductor materials including group III, group IV, and group V elements may also be used, in accordance with some embodiments of the present disclosure. Alternatively, the substrate may be a silicon-on-insulator (SOI) substrate, in accordance with some embodiments of the present disclosure.

In some embodiments, the device layer 41 may be an inter-layer dielectric (ILD) or an inter-metal dielectric layer (IMD) for forming interconnect structures (e.g., metal lines and/or vias). In such embodiments, the device layer 41 may be formed of low-k dielectric materials having k values, for example, lower than about 4.0 or even about 2.8. In some embodiments, the device layer 41 may be any layer in the semiconductor substrate W that may be patterned using photolithography and etching processes.

Although FIG. 3A illustrates only one device layer 41, the semiconductor substrate W may include numerous device layers, in accordance with some embodiments of the present disclosure. Furthermore, the device layer 41 may include a buffer layer (e.g., an oxide interfacial layer, not shown), an etch stop layer (e.g., a silicon nitride layer, a silicon carbide layer, or the like), or the like, in accordance with some embodiments of the present disclosure. The hard mask 42 may be formed over the device layer 41 for use as a patterning mask, in accordance with some embodiments of the present disclosure. The hard mask 42 may comprise an oxide, silicon oxynitride (SiON), silicon nitride ($Si_3N_4$), titanium nitride (TiN) or the like, in accordance with some embodiments of the present disclosure.

FIG. 3B illustrates the formation of an ashing-removable dielectric (ARD) 43 (e.g., comprising amorphous carbon, or the like), a bottom anti-reflective coating (BARC) 44, and a photoresist 45 over the hard mask 42, in accordance with some embodiments of the present disclosure. The BARC 44 and the ARD 43 are formed to aid in the patterning of the hard mask 42 with the photoresist 45, in accordance with some embodiments of the present disclosure. For example, the BARC 44 helps filter reflection from underlying layers during photolithography, and ARD 43 may be used for improved critical dimension uniformity, reduced line-edge roughness, and lower risk of defect during photolithography, in accordance with some embodiments of the present disclosure. The photolithography process used to pattern the photoresist 45 may include, for example, exposing portions of the photoresist 45 (e.g., using ultraviolet light) and removing the exposed or unexposed portion of the photoresist 45 depending on whether a positive or negative resist is used, in accordance with some embodiments of the present disclosure.

Next, as illustrated in FIG. 3C, the hard mask 42 is etched using the photoresist 45 as a patterning mask, in accordance with some embodiments of the present disclosure. The photoresist 45, the BARC 44, and first ARD 43 may then be removed, for example, using ashing and wet clean processes, in accordance with some embodiments of the present disclosure.

In some embodiments, the semiconductor substrate W being then scanned by a critical dimension scanning module connected to the computer to gather a first CD (critical dimension) of the semiconductor substrate W, and then the first CD taken bias by an global CD (average CD) of the entire semiconductor substrate W to get the first CDU, such as the step 120 of the critical dimension uniformity control method 100. In some embodiments, the critical dimension of the semiconductor substrate W is the distance between the portions of the hard mask 42 on the semiconductor substrate W. In some embodiments, the critical dimension of the semiconductor substrate W is the distance between the wirings on the semiconductor substrate W generated by suitable processes with the hard mask 42.

Figure 4A:
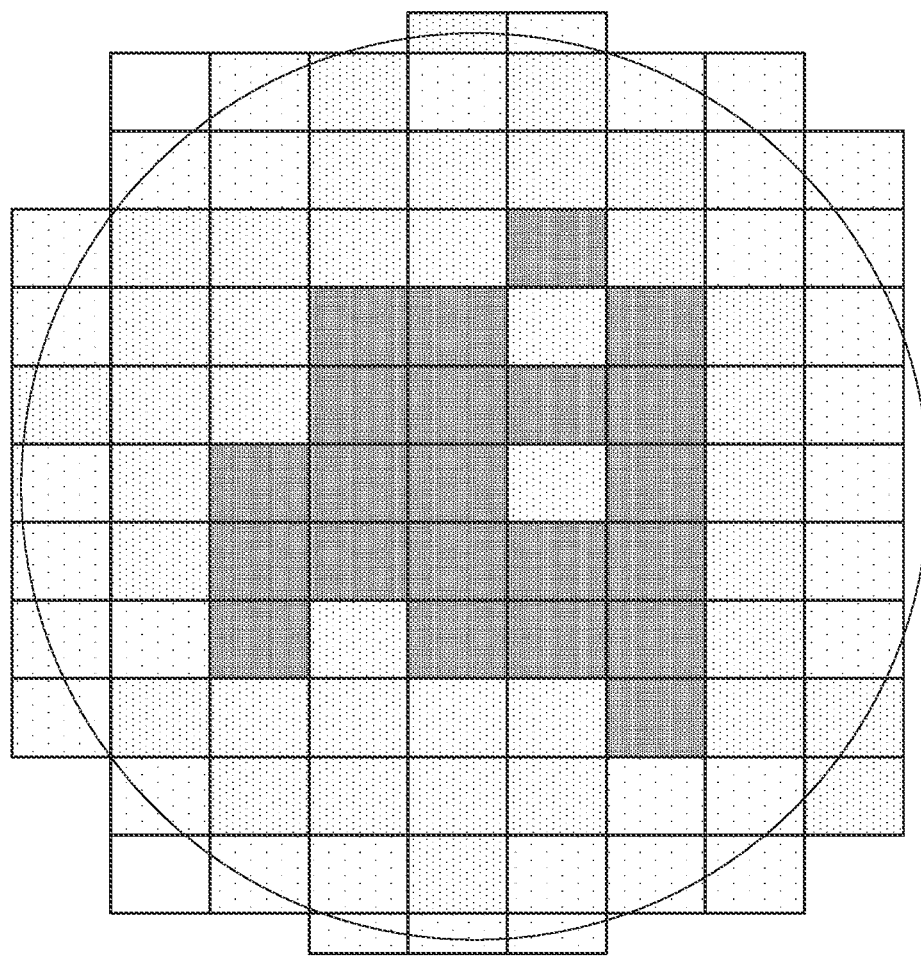
FIG. 4A shows a first inter dose mapper (DoMa) profile of the semiconductor substrate after the scanning, in accordance with some embodiments of the present disclosure.
Figure 4B:
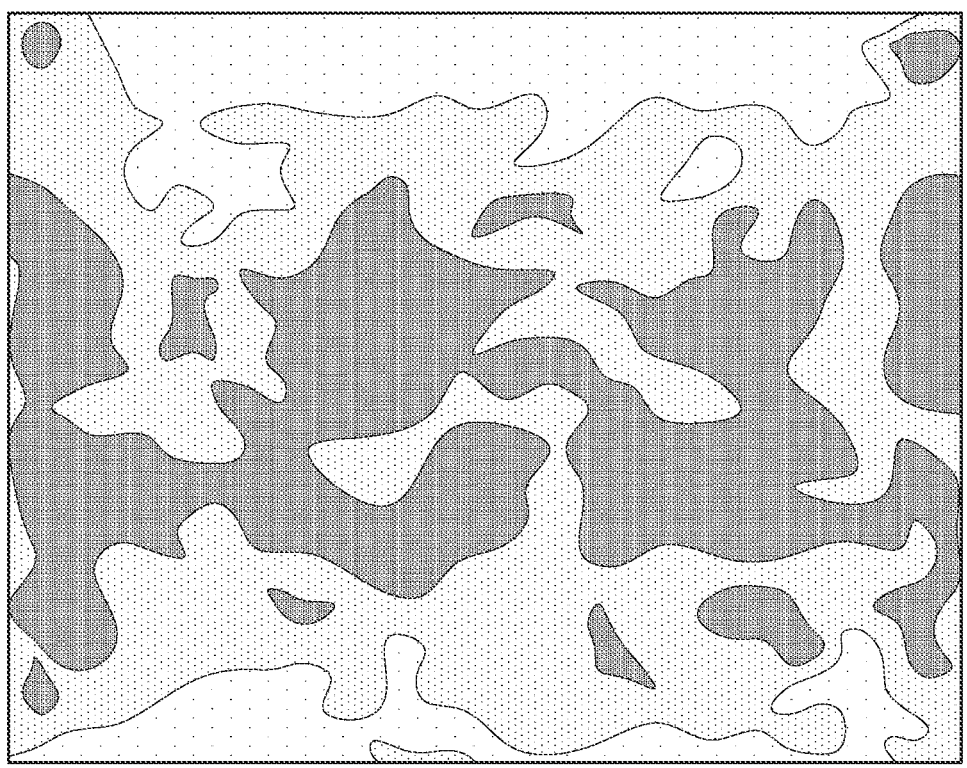
FIG. 4B shows a first intra dose mapper DoMa profile of the semiconductor substrate after the scanning, in accordance with some embodiments of the present disclosure.

FIG. 4A shows a first inter dose mapper (DoMa) profile 202 of the semiconductor substrate W after the scanning, in accordance with some embodiments of the present disclosure. FIG. 4B shows a first intra DoMa profile 204 of the semiconductor substrate W after the scanning, in accordance with some embodiments of the present disclosure. In some embodiments, the first inter DoMa profile 202 shows the critical dimension uniformity of the entire semiconductor substrate W, which includes a plurality of dies. The first intra DoMa profile 204 shows the critical dimension uniformity of one of the dies of the semiconductor substrate W, in accordance with some embodiments of the present disclosure. Regions with higher CDU are shown by denser dots, and regions with lower CDU are shown by lighter dots, in accordance with some embodiments of the present disclosure.

In some embodiments, the critical dimension scanning module may use critical dimension scanning electron microscopy (CDSEM) to measure critical dimensions (e.g., pitch, width of patterned features, spacing between patterned features, or the like) of test sites on various device dies across the semiconductor substrate W. The first inter DoMa profile 202 provides critical dimension measurements for features (e.g., the hard mask 42) in different locations of the semiconductor substrate W after a first surface process, such as the process shown in FIG. 3A to FIG. 3C. Furthermore, the first inter DoMa profile 202 and first intra DoMa profile 204 may provide information related to critical dimension uniformity such as mean, standard deviation, range, and the like. Although the first inter DoMa profile 202 and first intra DoMa profile 204 includes specific measurements, one of ordinary skill in the art would recognize the actual measurements of the first inter DoMa profile 202 and first intra DoMa profile 204 (and any other DoMa profile described herein) may vary.

In some embodiments, as shown in FIG. 4A, the CDU in the center of the semiconductor substrate W is substantially higher than the edge. In some embodiments, the CDU in the center of one die of the semiconductor substrate W is substantially higher than the right side and the left side, as shown in FIG. 4B.

In some embodiments, the first CDU of the semiconductor substrate W can be achieved by analyzing the first inter DoMa profile 202 and first intra DoMa profile 204. Afterwards, a first calibration process is determined based on the measured first CDU, such as the step 130 in FIG. 3, in accordance with some embodiments. For example, the first calibration process may be determined by an intra dose correction step 132 for correcting reticle-dependent deviation, a thru-slit dose sensitivity correction step 134 for correcting time-dependent deviation, and an inter dose correction step 136 for correcting process-dependent deviation.

Figure 5A:
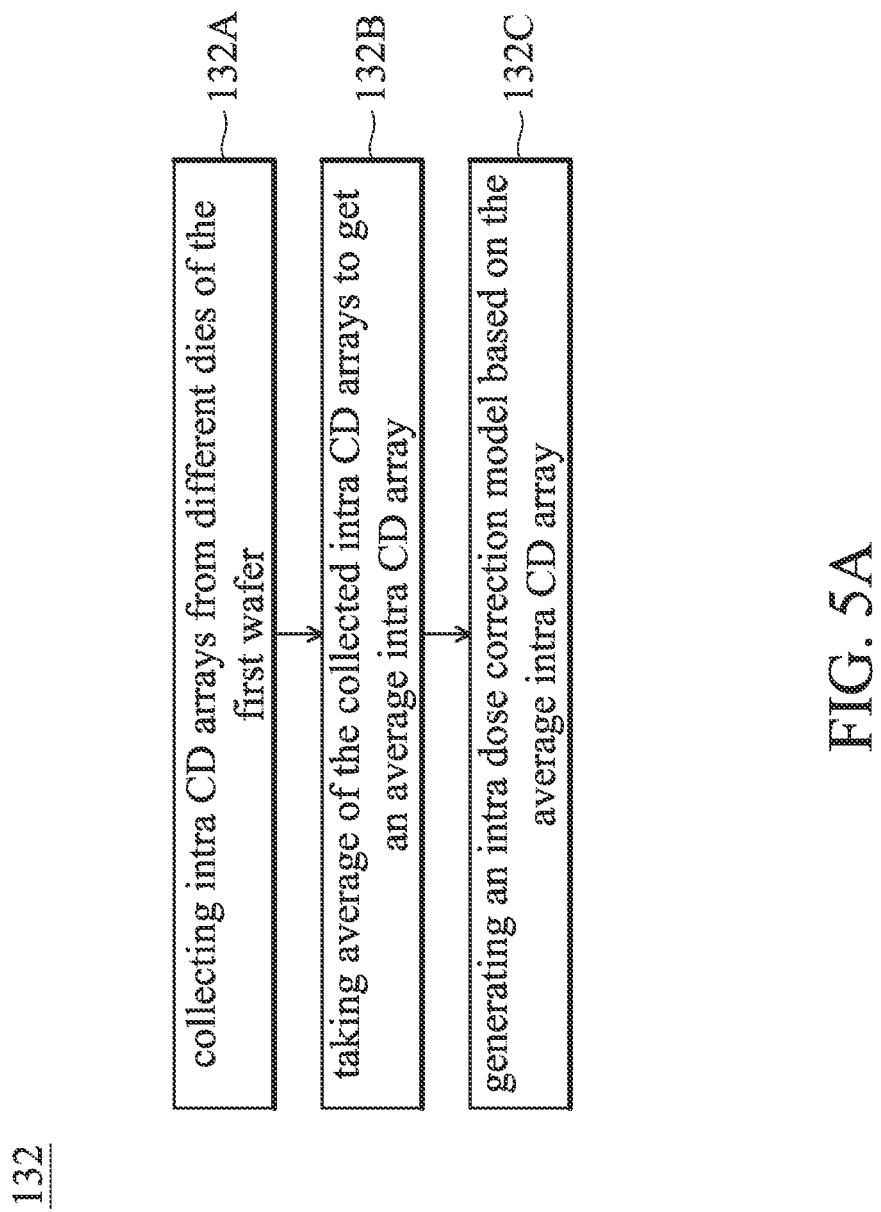
FIG. 5A shows detail steps of the intra dose correction step, in accordance with some embodiments of the present disclosure.
Figure 5B:
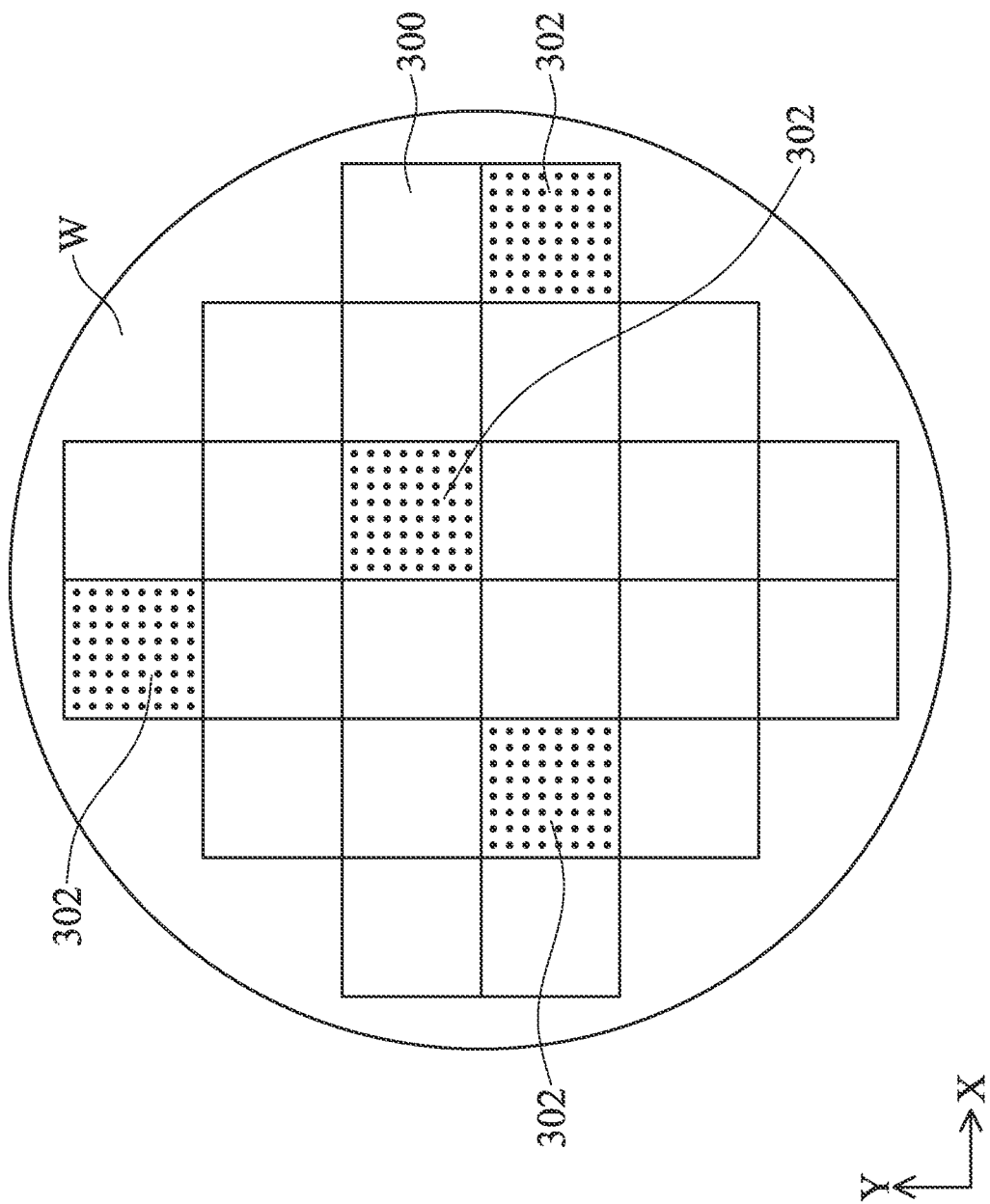
FIG. 5B shows an example of the intra CDU arrays, in accordance with some embodiments of the present disclosure.

FIG. 5A shows detail steps of the intra dose correction step 132, in accordance with some embodiments of the present disclosure. In some embodiments, the intra dose correction step 132 includes a step 132A for collecting intra CD arrays 302 from different dies 300 of a first wafer (e.g. the semiconductor substrate W). In some embodiments, each of the intra CD arrays 302 includes a plurality of CD points arranged in a first direction (e.g. the X direction) and a second direction (e.g. the Y direction), such as a 8*8 array, a 10*10 array, or a 20*20 array, etc. FIG. 5B shows an example of the intra CD arrays 302, in accordance with some embodiments of the present disclosure. The numbers of the points in the intra CD arrays 302 are not limited, depending on design requirements. For example, CDs in 4 dies 300 are collected, so 4 intra CD arrays 302 are gathered in some embodiments. Therefore, the required number of dies to be measured is reduced, and the yield is enhanced in some embodiments.

In some embodiments, the intra dose correction step 132 includes a step 132B for taking average of the collected intra CD arrays 302 to get an average intra CD array. For example, the four 8*8 arrays 302 achieved in the step 132A are taken average to get the average intra CD array, which has an identical size of the intra CD arrays 302 (8*8 in this example, and can be other numbers depending on design requirement). The average intra CD array indicates a normalized CD array which shows the average CD profile of the semiconductor substrate W after being processed with the reticle M, and the average intra CD of the die can be determined by the average intra CD array. Afterwards, the value of the average intra CD is taken bias with the global CD of the entire semiconductor substrate W to get an average intra CDU array, in accordance with some embodiments of the present disclosure.

In some embodiments, the intra dose correction step 132 includes a step 132C for generating a preliminary intra dose correction model based on the average intra CDU array. In some embodiments, the average intra CDU array is calculated (e.g. by a computer connected to the critical dimension scanning module) with the preliminary intra dose correction model to determine the calibration in different directions. For example, the preliminary intra dose correction model includes a first intra dose correction sub-model used for controlling exposure dose and a second intra dose correction sub-model for controlling exposure time, in accordance with some embodiments of the present disclosure. In some embodiments, the first intra dose correction sub-model is determined based on the CDU points of the average intra CDU array arranged in the first direction (e.g. the X direction), and the second intra dose correction sub-model is determined based on the CDU points of the average intra CDU array arranged in the second direction (e.g. the Y direction).

In some embodiments, during the exposure process, an exposure slit extends in the first direction, and the scanning is performed along in the second direction. Therefore, the first intra dose correction sub-model is used for calibrating the critical dimension uniformity caused by the exposure slit, and the second intra dose correction sub-model is used for calibrating the critical dimension uniformity caused by the energy uniformity during the exposure, in accordance with some embodiments of the present disclosure. In some embodiments, the first intra dose correction sub-model and the second intra dose correction sub-model are different. In some embodiments, the first intra dose correction sub-model is a Unicom model, and the second intra dose correction sub-model is a Dosicom model. After the step 132C, an average intra CD is determined, in accordance with some embodiments of the present disclosure.

Figure 5C:
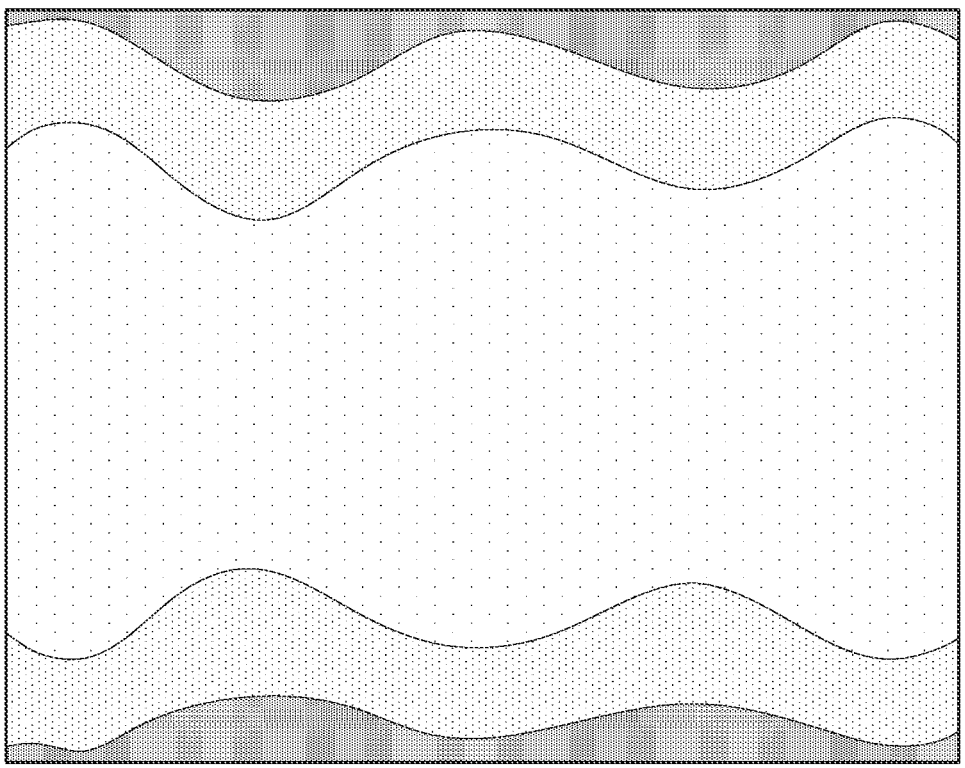
FIG. 5C is an example of the calculated result after the step for generating a preliminary intra dose correction model based on the average intra CDU array, in accordance with some embodiments of the present disclosure.

FIG. 5C is an example of the calculated result for compensating CDU, which is gathered after the step 132C for generating the preliminary intra dose correction model based on the average intra CD array, in accordance with some embodiments of the present disclosure. Denser region means the region that needs to be compensated more, and vice versa, in accordance with some embodiments of the present disclosure. The example corresponds to the die shown in the first intra DoMa profile 204. Since the first intra DoMa profile 204 shows higher CDU in the middle, and lower CDU at the left and the right sides, the calculated result as shown in FIG. 5C has a higher compensating value on the left and the right sides, and has a negative value on the middle. Therefore, the critical dimension uniformity of the die shown in FIG. 4B can be compensated by the calculated result shown in FIG. 5C. In some embodiments, the CDU caused by different reticles, such as affected by short-range or long range proximity of electron beam, can be corrected by the step 132.

Figure 6A:
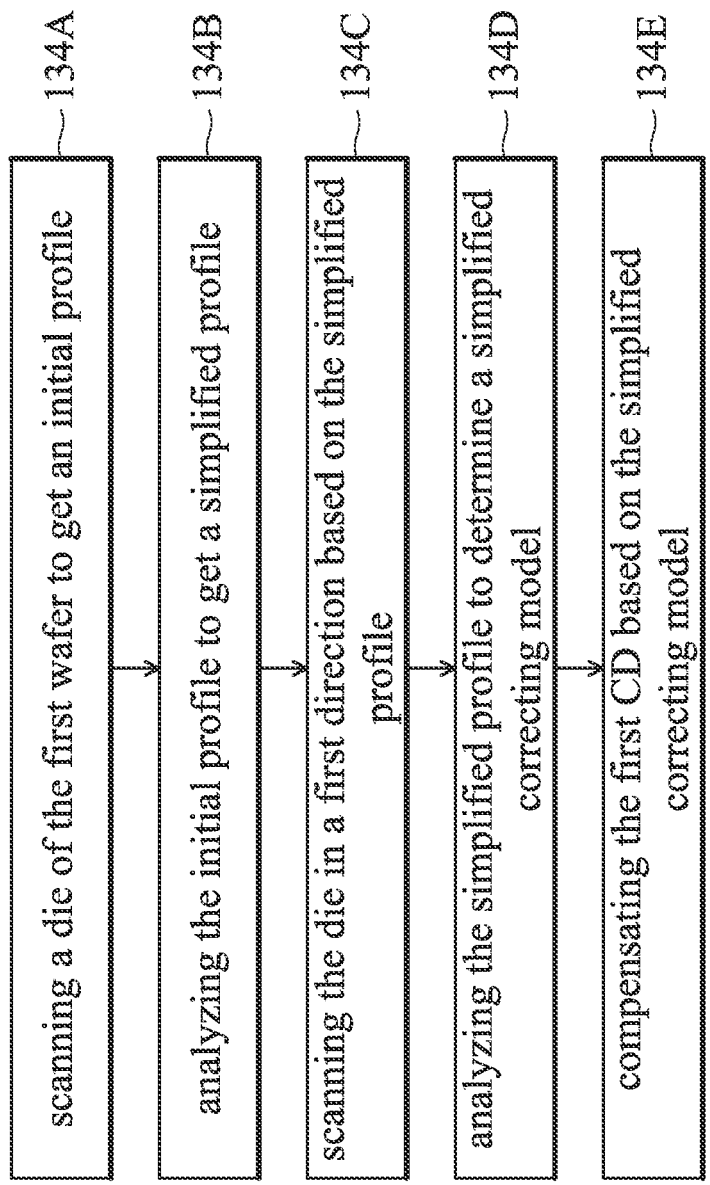
FIG. 6A shows detail steps of the thru-slit dose sensitivity correction step, in accordance with some embodiments of the present disclosure.

FIG. 6A shows detail steps of the thru-slit dose sensitivity correction step 134, in accordance with some embodiments of the present disclosure. In some embodiments, the thru-slit dose sensitivity correction step 134 includes a step 134A of scanning a die of the first wafer to get an initial profile, such as scanning a die of the semiconductor substrate W, as shown in FIG. 4B. Afterwards, the thru-slit dose sensitivity correction step 134 goes to step 134B, wherein the initial profile is analyzed to get a simplified model, such as an 8*8 array, a 10*10 array, or a 20*20 array, in accordance with some embodiments of the present disclosure.

Figure 6B:
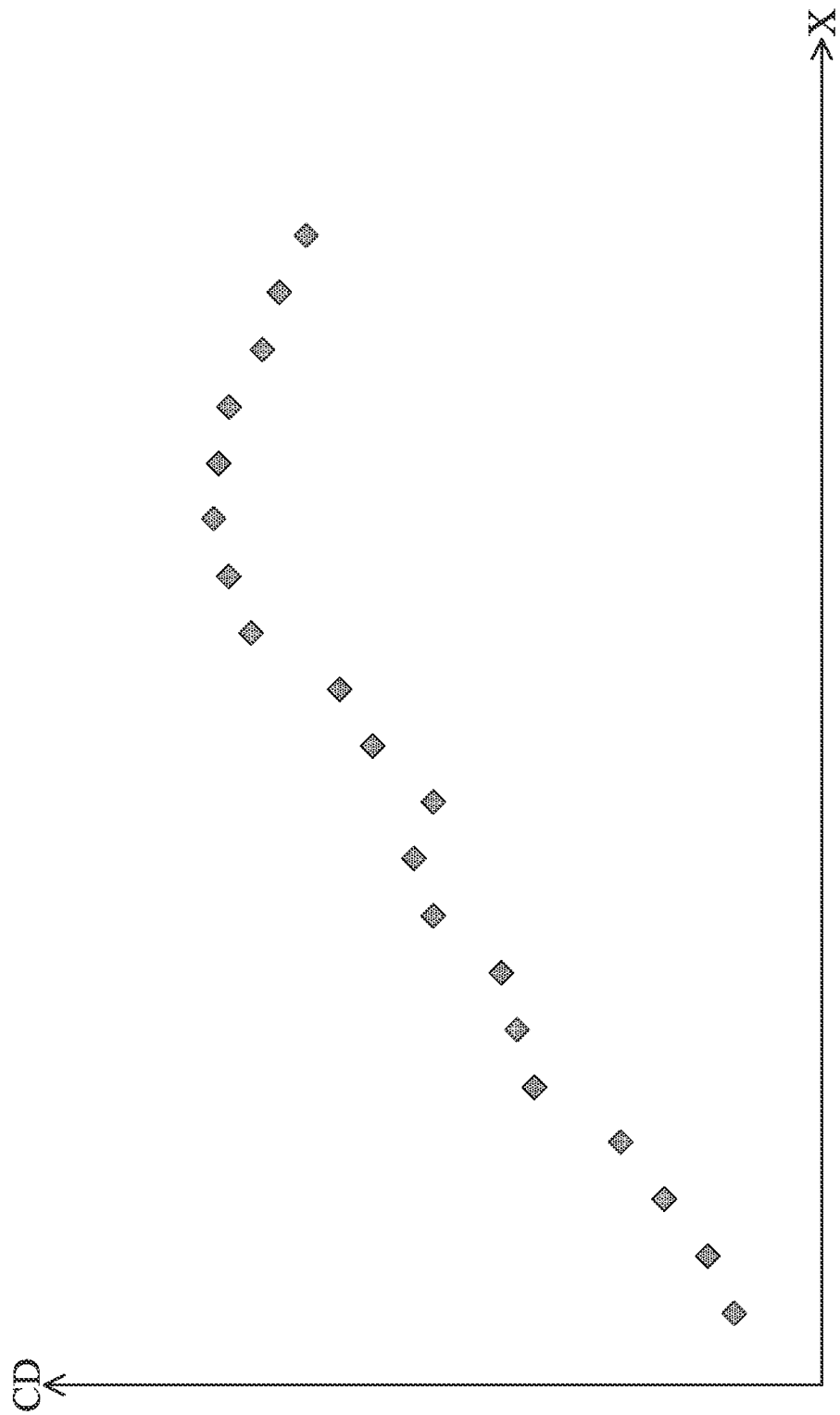
FIG. 6B shows a certain amount CDU points in different position, in accordance with some embodiments of the present disclosure.
Figure 6C:
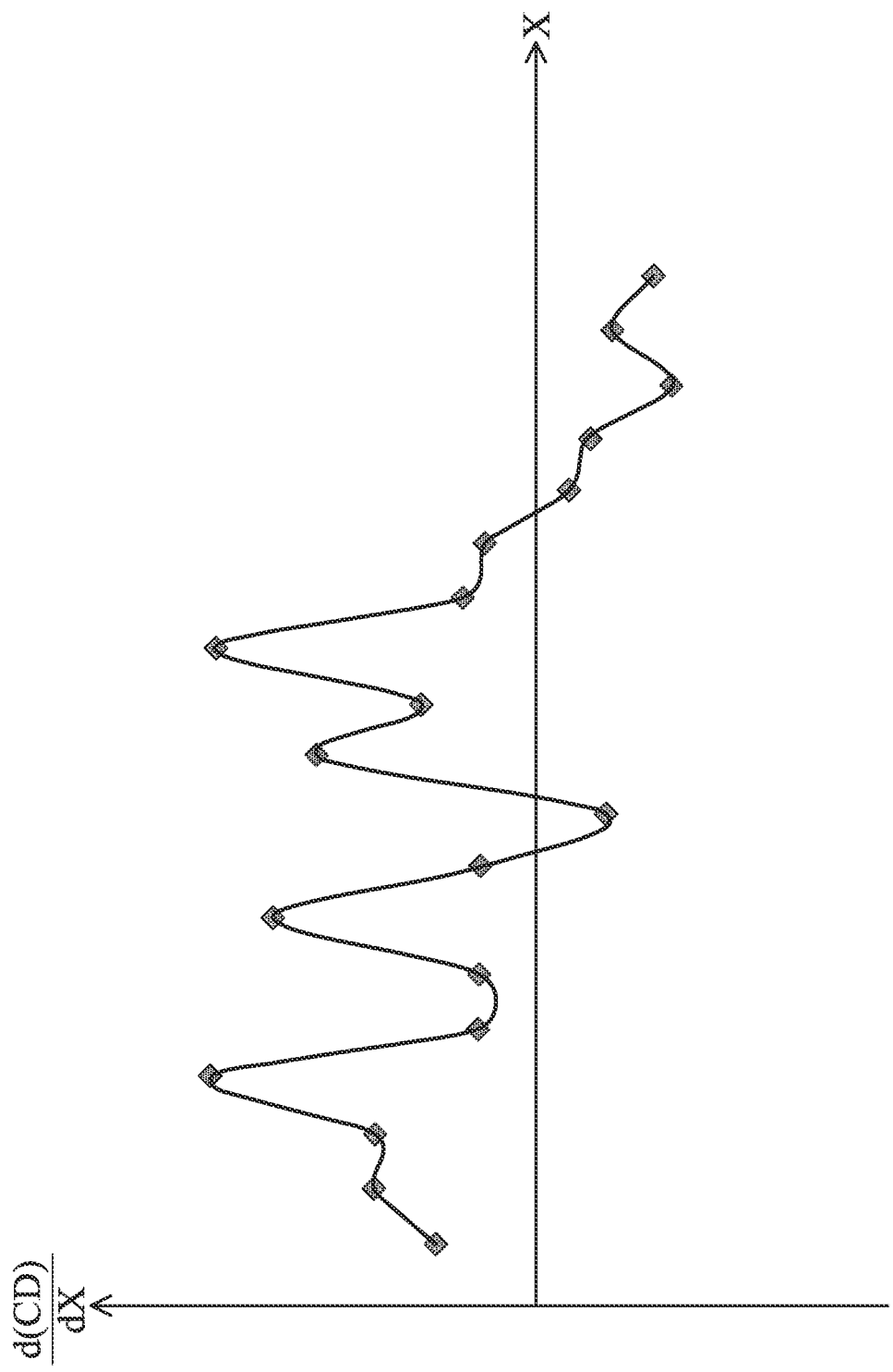
FIG. 6C shows a slope profile differentiated from FIG. 6B, in accordance with some embodiments of the present disclosure.

Afterwards, in the step 134C, the die is scanned (e.g. by CDSEM) in a first direction based on the simplified profile, such as scanned along the direction that the slit extends (i.e. the X direction), in accordance with some embodiments of the present disclosure. FIG. 6B shows a certain amount CD points in different position after the die is scanned in the X direction, in accordance with some embodiments of the present disclosure. Afterwards, in the step 134D, the simplified profile is analyzed to determine a simplified correcting model, in accordance with some embodiments of the present disclosure. For example, FIG. 6C shows a slope profile (a differential function) differentiated from FIG. 6B, in accordance with some embodiments of the present disclosure. Next, numbers of critical points are taken from the slope profile, such as a maximum point, a minimum point, zero points, and endpoints, in accordance with some embodiments of the present disclosure. In some embodiments, the zero point here means the points with $d(CD)/dX=0$. As shown in FIG. 6C, one maximum point, one minimum point, three zero points, and two end points are achieved, in accordance with some embodiments of the present disclosure. In other words, the number of the critical points is 7 in this embodiment. Other embodiments may have different number of critical points, depending on design requirement.

Figure 6D:
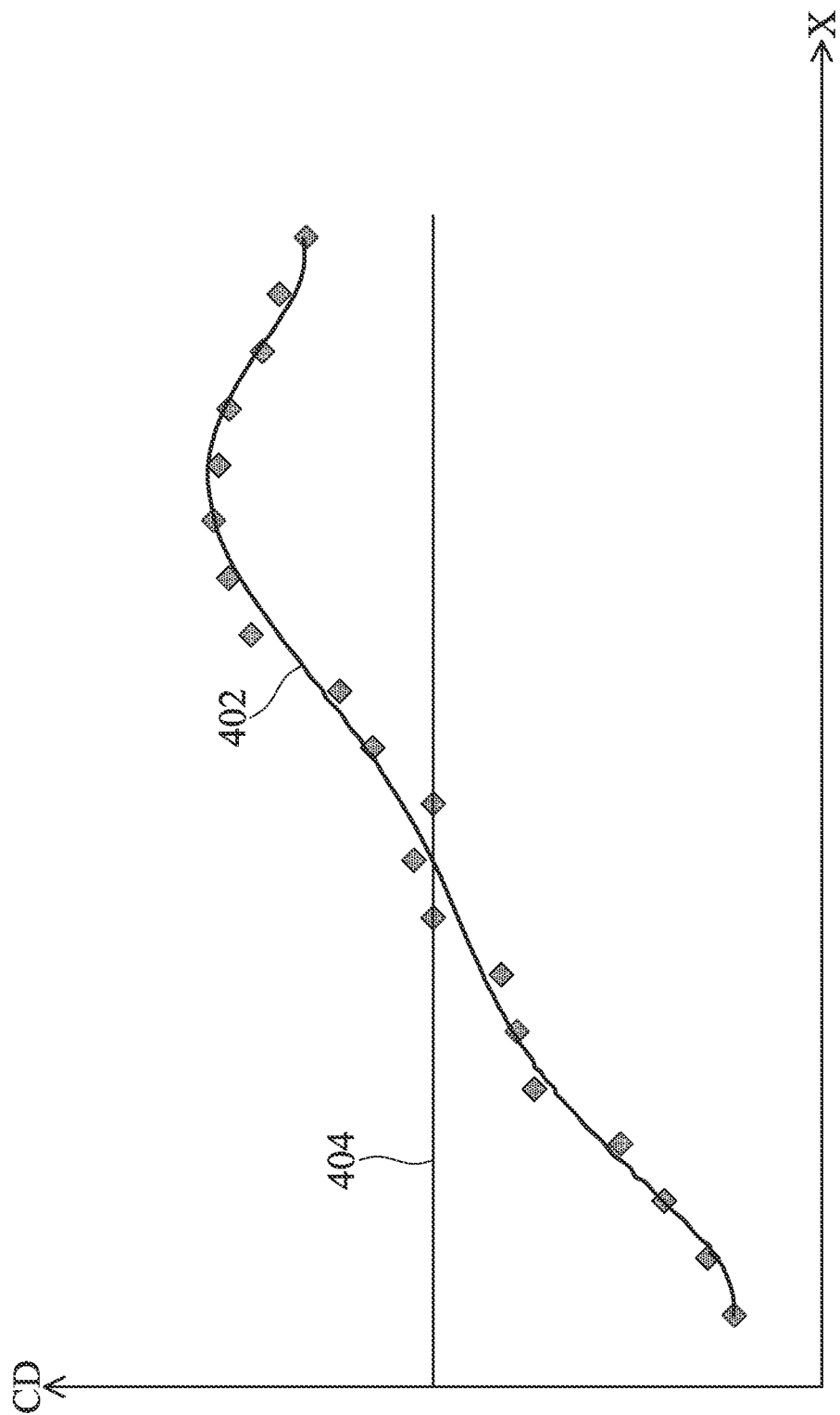
FIG. 6D shows a regression curve of the simplified profile, in accordance with some embodiments of the present disclosure.

Afterwards, a regression curve 402 for fitting the simplified profile is determined, as shown in FIG. 6D, in accordance with some embodiments of the present disclosure. In some embodiments, the order of the regression curve 402 is less than the number of the critical points. For example, the regression curve 402 is a polynomial with an order that equals to the number of the critical points minus 1. For example, the critical points in the embodiment shown in FIG. 6C is 7, so the order of the regression curve 402 is 7-1=6. Therefore, the simplified profile can be repressed by the regression curve 402, which is a polynomial and thus facilitates subsequent calculations, in accordance with some embodiments of the present disclosure.

Figure 6E:
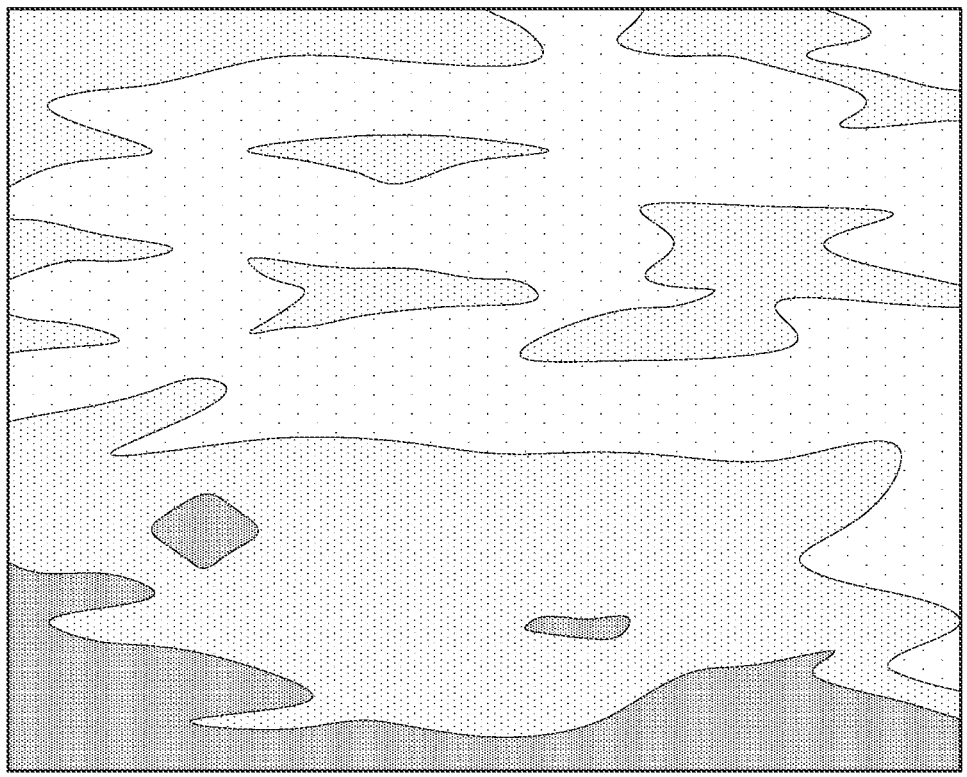
FIG. 6E shows the simplified correcting model, in accordance with some embodiments of the present disclosure.

In some embodiments, a simplified correcting model can be generated by the regression curve 402 and an average CD 404 of the simplified profile. The average CD 404 can be determined by adding the CD values of each points and then divided by the number of the points, in accordance with some embodiments of the present disclosure. The simplified correcting model is used for compensating the points in the regression curve 402 to be closer to the average CD 404. For example, FIG. 6E shows the simplified correcting model, in accordance with some embodiments of the present disclosure. Denser color means the CDU is compensated more, and vice versa, in accordance with some embodiments of the present disclosure. Since the left side (closer to X=0) in FIG. 6D has a lower value of CD, the left side is further compensate to allow the feature more uniform, which means making the points in the regression curve 402 closer to the average CD 404, in accordance with some embodiments of the present disclosure. The compensation value is called as thru-slit sensitivity, which means CD [nm] per percentage change in dose [mJ], in accordance with some embodiments of the present disclosure. It should be noted that the thru-slit sensitivity is a function of position, in accordance with some embodiments of the present disclosure. In other words, the first CDU is compensated based on the simplified correcting model, in accordance with some embodiments of the present disclosure. In some embodiments, the CDU caused by time and different tools (e.g. different EUV apparatuses) can be corrected by the step 134.

In some embodiments, the preliminary intra dose correction model achieved in the intra dose correction step 132 and the simplified correcting model (thru-slit sensitivity) achieved in thru-slit dose sensitivity correction step 134 are combined to get an intra dose correction model. For example, the intra dose correction value of the intra dose correction model of each die 300 is than determined by the following equation:

$$\frac{\text{average intra } CD - \text{global } CD}{\text{thru-slit sensitivity}} = \text{intra dose correction value of the die}$$

The intra dose correction value is a coefficient for adjusting the exposure dose, in accordance with some embodiments of the present disclosure. In other words, the intra dose correction value is calculated by a difference between the average intra CD and the regression curve, and then divided by the thru-slit sensitivity, in accordance with some embodiments of the present disclosure. Since the thru-slit sensitivity is a function of position, the intra dose correction value at different position may be different in some embodiments of the present disclosure.

Figure 7A:
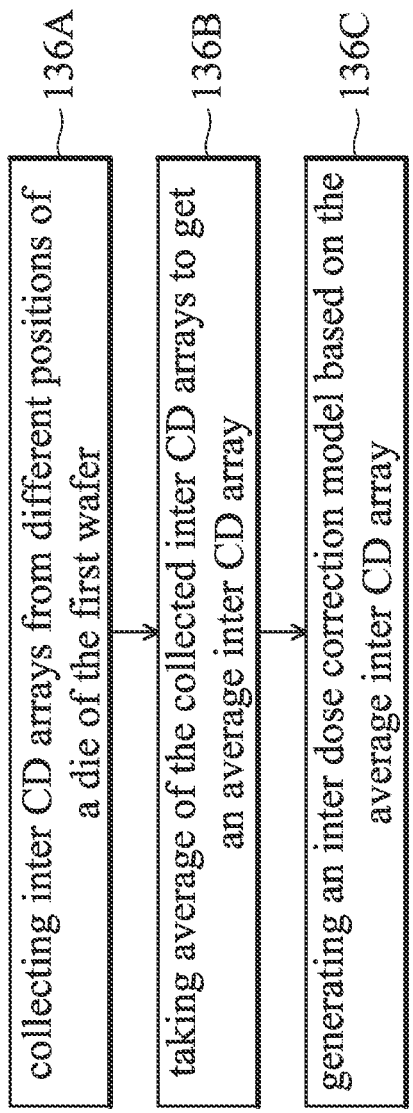
FIG. 7A shows detail steps of the inter dose correction step, in accordance with some embodiments of the present disclosure.
Figure 7B:
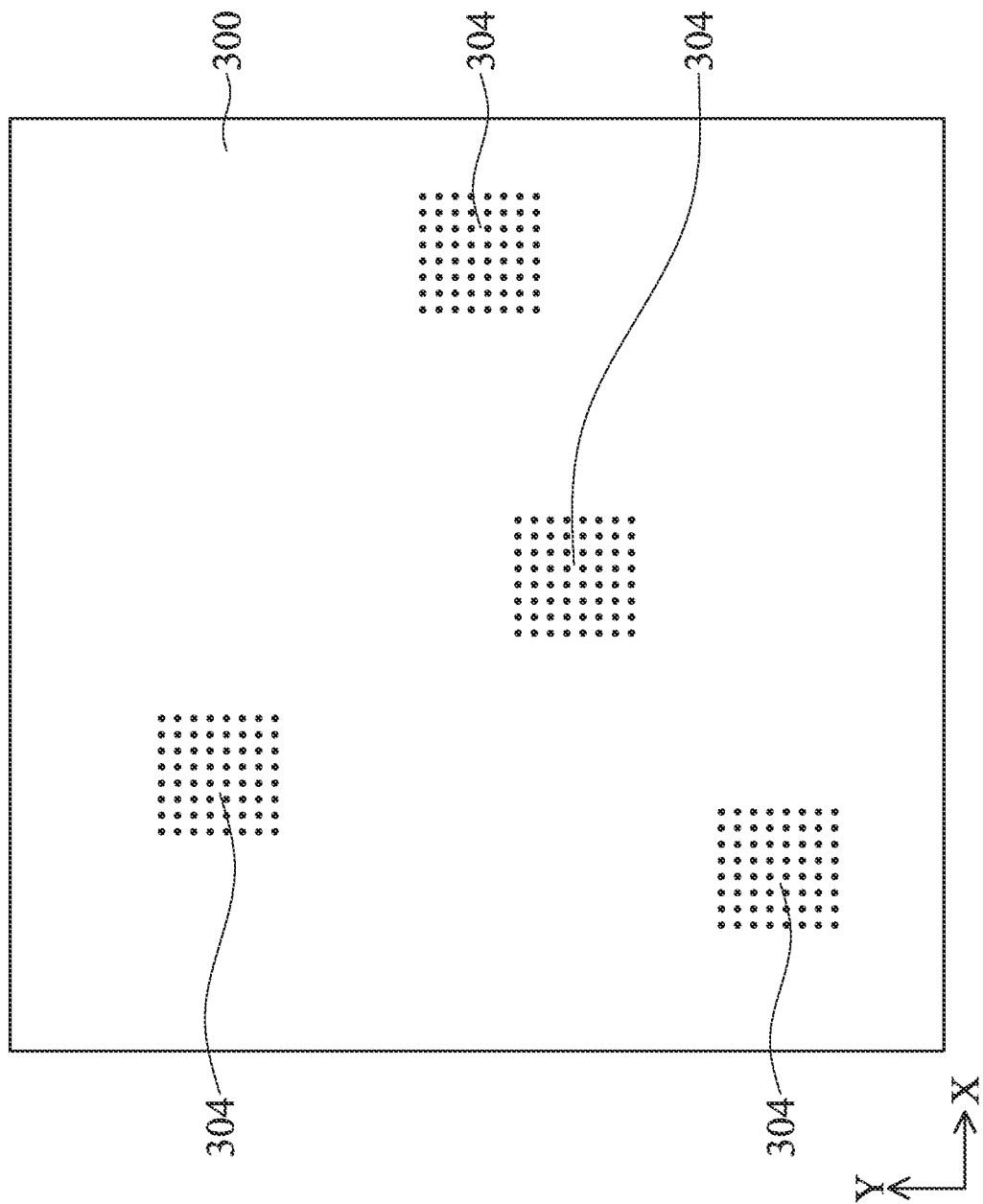
FIG. 7B shows an example of the inter CDU arrays, in accordance with some embodiments of the present disclosure.

FIG. 7A shows detail steps of the inter dose correction step 136, in accordance with some embodiments of the present disclosure. In some embodiments, the inter dose correction step 136 includes a step 136A for collecting inter CD arrays 304 from different positions of a die 300 of the semiconductor substrate W. In some embodiments, each of the inter CD arrays 304 includes a plurality of CD points arranged in a first direction (e.g. the X direction) and a second direction (e.g. the Y direction), such as an 8*8 array, a 10*10 array, or a 20*20 array. The size of the array is not limited and can be determined on different design requirements, in accordance with some embodiments of the present disclosure. FIG. 7B shows an example of the inter CD arrays 304, in accordance with some embodiments of the present disclosure. The numbers of the points in the inter CD arrays 304 are not limited, depending on design requirements. For example, in this embodiment, CD in 4 positions of the die 300 are collected, so 4 inter CD arrays 304 are gathered.

In some embodiments, the inter dose correction step 136 includes a step 136B for taking average of the collected inter CD arrays 304 to get an average inter CD array. For example, the four 8*8 arrays achieved in the step 136A are taken average to get the average inter CD array, which has an identical size of the inter CD arrays 304 (8*8 in this example, and can be other numbers depending on design requirement). The average inter CD array indicates an average inter CD of the selected die 300. The steps 136A and 136B are then performed to all dies 300 of the semiconductor substrate W, so a plurality of average inter CD of each dies are achieved, in accordance with some embodiments of the present disclosure.

In the step 136C, the plurality of average inter CD of the dies 300 are taken average again to get a global CD of the entire semiconductor substrate W, in accordance with some embodiments of the present disclosure. The inter dose correction value of each die 300 is than determined by the following equation:

$$\frac{\text{average inter } CD - \text{global } CD}{\text{dose sensitivity}} = \text{inter dose correction value of the die}$$

Figure 7C:
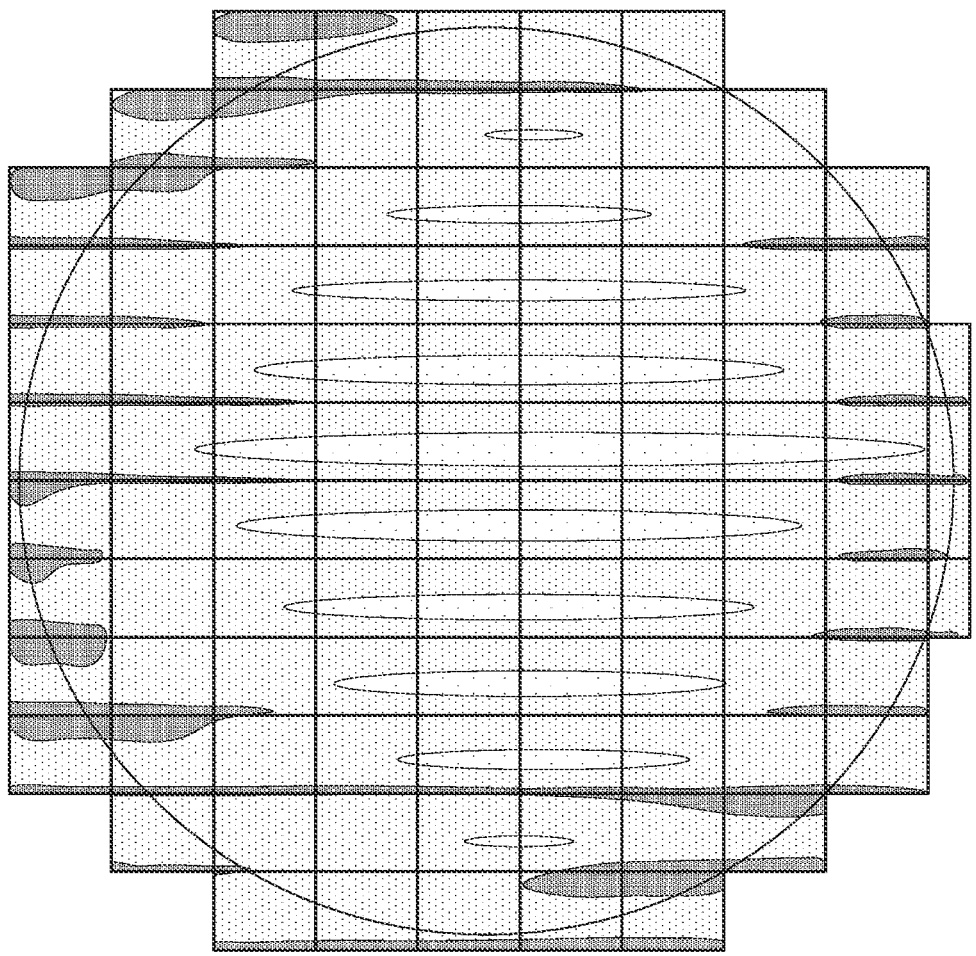
FIG. 7C shows the compensation result after the step for correcting process-dependent deviation, in accordance with some embodiments of the present disclosure.

The inter dose correction value is a coefficient for adjusting the exposure dose, which means the percentage of the exposure dose to be adjusted, in accordance with some embodiments of the present disclosure. The dose sensitivity is the relation between dose and critical dimension, which means CD [nm] per percentage change in dose [mJ], in accordance with some embodiments of the present disclosure. FIG. 7C shows the compensation result after the step 136, in accordance with some embodiments of the present disclosure. In some embodiments, the combination of the inter dose correction value of the dies may be called as an inter dose correction model, such as a table recording inter dose correction values of different dies in different positions. In some embodiments, the CDU caused by different processes can be corrected by the step 136.

After the first calibration process is determined, the first surface process (e.g. the process in FIG. 3A to FIG. 3C) is calibrated by the first calibration process to get a second surface process, in accordance with some embodiments of the present disclosure. For example, the exposure dose or the exposure speed (time) is adjusted based on the first calibration process, in accordance with some embodiments of the present disclosure. In some embodiments, both of the intra dose correction value and the inter dose correction value are used for calibrating the exposure dose or the exposure speed (time), and the contribution of each value is depending on design requirement, such as calculated by the computer.

Figure 8A:
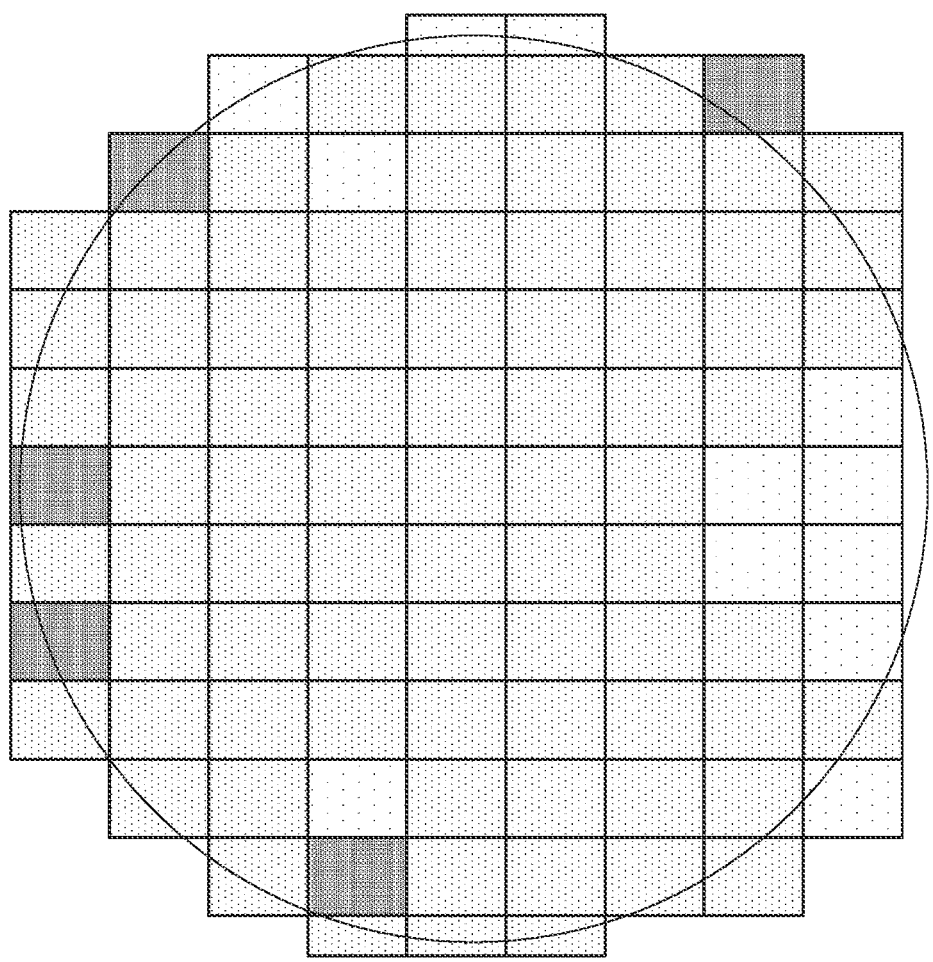
FIG. 8A shows a second inter DoMa profile after performing the second surface process to another semiconductor substrate, in accordance with some embodiments of the present disclosure.
Figure 8B:
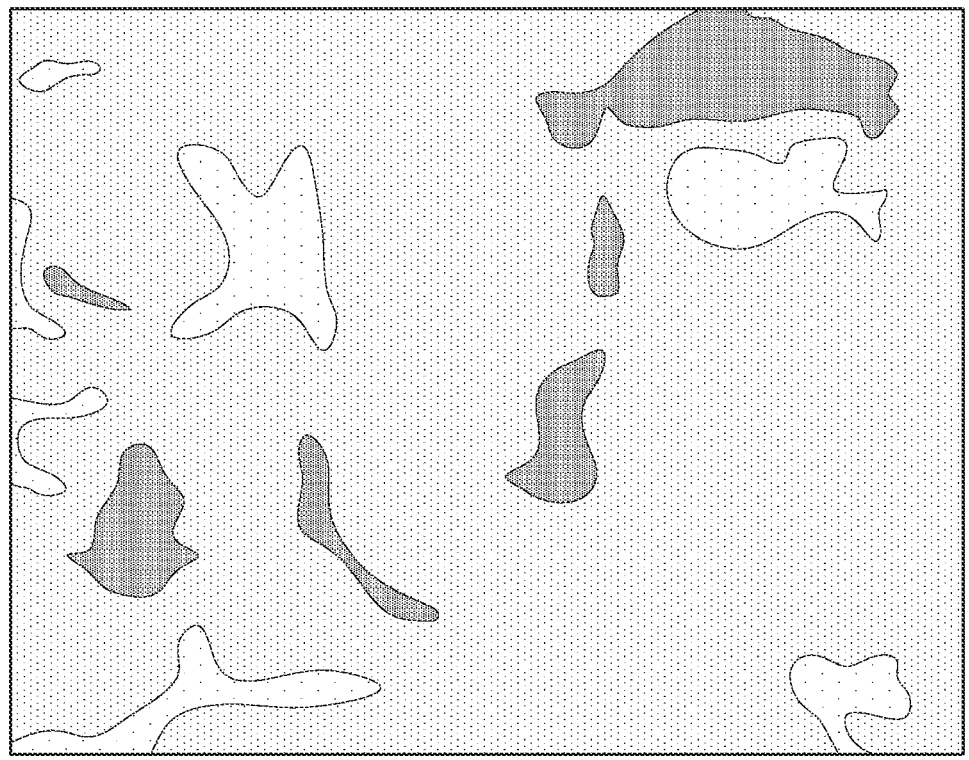
FIG. 8B shows a second intra DoMa profile after performing the second surface process to another semiconductor substrate, in accordance with some embodiments of the present disclosure.

FIG. 8A shows a second inter DoMa profile 502 after performing the second surface process to another semiconductor substrate W, in accordance with some embodiments of the present disclosure. FIG. 8B shows a second intra DoMa profile 504 after performing the second surface process to another semiconductor substrate W (second wafer), in accordance with some embodiments of the present disclosure. In some embodiments, when comparing with the first inter DoMa profile 202 and the first intra DoMa profile 204, the second inter DoMa profile 502 and the second intra DoMa profile 504 show more uniform profiles, which indicates lower CDU, in accordance with some embodiments of the present disclosure. In other words, the second wafer (another semiconductor substrate W) has a second CDU after the second surface process, and the second CDU is less than the first CDU of the semiconductor substrate W shown in FIG. 4A and FIG. 4B, in accordance with some embodiments of the present disclosure.

In some embodiments, the critical dimension uniformity control method 100 may be performed again to achieve a lower CDU if needed. For example, after the second surface process, the second CDU is gathered from the second wafer, and then a second calibration process is determined based on the second CDU, such as the determination described in the step 130. Afterwards, the second surface process is calibrated by the second calibration process to determine a third surface process different from the second surface process. For example, in some embodiments, the intra dose correction value and the inter dose correction value achieved in the first calibration process are compared with the intra dose correction value and the inter dose correction value achieved in the second calibration process to determine the detail of the third surface process.

Next, the third surface process is performed to a third wafer (another semiconductor substrate W), wherein the third wafer has a third CDU after the third surface process, and the third CDU is less than the second CDU, in accordance with some embodiments of the present disclosure. In other words, the critical dimension uniformity control method 100 can keep calibrating the CDU, which simplifies the process and increases the yield.

In summary, a critical dimension uniformity control method and a semiconductor substrate processing system are provided in some embodiments of the present disclosure. The method provides a calibration process which enhances the critical dimension uniformity of the semiconductor substrate caused by the process, and reduces the required time of the process. Therefore, the yield is increased.

A critical dimension uniformity control method is provided in some embodiments of the present disclosure. In some embodiments, the method includes gathering a first CDU by a first critical dimension from a first wafer after being processed by a first surface process. In some embodiments, the method includes determining a first calibration process based on the first CDU. In some embodiments, the determining includes an intra dose correction step for correcting reticle-dependent deviation, a thru-slit dose sensitivity correction step for correcting time-dependent deviation, and an inter dose correction step for correcting process-dependent deviation. In some embodiments, the method includes calibrating the first surface process by the first calibration process to determine a second surface process different from the first surface process.

A critical dimension uniformity control method is provided in some embodiments of the present disclosure. In some embodiments, the method includes performing a first surface process to a first wafer by a semiconductor substrate processing system, wherein the first wafer has a first CDU after the first surface process. In some embodiments, the method includes gathering the first CDU from the first wafer. In some embodiments, the method includes determining a first calibration process based on the first CDU. In some embodiments, the method includes the determining includes an intra dose correction step for correcting reticle-dependent deviation, a thru-slit dose sensitivity correction step for correcting time-dependent deviation, and an inter dose correction step for correcting process-dependent deviation. In some embodiments, the method includes calibrating the first surface process by the first calibration process to determine a second surface process. In some embodiments, the method includes performing the second surface process to a second wafer, wherein the second wafer has a second CDU after the second surface process, and the second CDU is less than the first CDU.

A semiconductor substrate processing system in some embodiments of the present disclosure. In some embodiments, the semiconductor substrate processing system includes a critical dimension scanning module configured to gather a first critical dimension uniformity from a first wafer. In some embodiments, the semiconductor substrate processing system includes a computer connected to the critical dimension scanning module. In some embodiments, the computer is configured for determining a first calibration process based on the first CDU. In some embodiments, the determining includes an intra dose correction step for correcting reticle-dependent deviation, a thru-slit dose sensitivity correction step for correcting time-dependent deviation, and an inter dose correction step for correcting process-dependent deviation. In some embodiments, the computer is configured for calibrating the first surface process by the first calibration process to determine a second surface process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A critical dimension uniformity (CDU) control method, comprising:
    gathering a first CDU by a first critical dimension (CD) from a first wafer after being processed by a first surface process;
    determining a first calibration process based on the first CDU, wherein the determining comprises:
        an intra dose correction step for correcting reticle-dependent deviation;
        a thru-slit dose sensitivity correction step for correcting time-dependent deviation; and
        an inter dose correction step for correcting process-dependent deviation; and
    calibrating the first surface process by the first calibration process to determine a second surface process different from the first surface process.

2. The critical dimension uniformity (CDU) control method as claimed in claim 1, wherein the intra dose correction step comprises:
    collecting intra CD arrays from different dies of the first wafer, wherein each of the intra CD arrays comprise a plurality of CD points arranged in a first direction and a second direction;
    taking average of the collected intra CD arrays to get an average intra CD array, wherein the average intra CD array comprise a plurality of CD points arranged in the first direction and the second direction; and
    generating a preliminary intra dose correction model based on the average intra CD array.

3. The critical dimension uniformity (CDU) control method as claimed in claim 2, wherein the preliminary intra dose correction model comprises:
    a first intra dose correction sub-model used for controlling exposure dose; and
    a second intra dose correction sub-model for controlling exposure time, wherein the first intra dose correction sub-model is determined based on the CD points of the average intra CD array arranged in the first direction, and the second intra dose correction sub-model is determined based on the CD points of the average intra CD array arranged in the second direction.

4. The critical dimension uniformity (CDU) control method as claimed in claim 3, wherein the thru-slit dose sensitivity correction step comprises:
    scanning a die of the first wafer to get an initial profile;
    analyzing the initial profile to get a simplified profile;
    analyzing the simplified profile to determine a simplified correcting model; and
    compensating the first CDU based on the simplified correcting model.

5. The critical dimension uniformity (CDU) control method as claimed in claim 4, wherein analyzing the simplified profile comprises:

differentiating the simplified profile to get a slope profile;
determining a maximum point, a minimum point, zero points, and endpoints of the slope profile; and
generating the simplified correcting model based on the simplified profile, the maximum point, the minimum point, the zero points, and the endpoints.

6. The critical dimension uniformity (CDU) control method as claimed in claim 4, wherein an intra dose correction model is determined by the preliminary intra dose correction model and the simplified correcting model.

7. The critical dimension uniformity (CDU) control method as claimed in claim 1, wherein the inter dose correction step comprises:
collecting inter CD arrays from different positions of a die of the first wafer, wherein each of the inter CD arrays comprises a plurality of CD points arranged in a first direction and a second direction;
taking average of the collected inter CD arrays to get an average inter CD array; and
generating an inter dose correction model based on the average inter CD array.

8. The critical dimension uniformity (CDU) control method as claimed in claim 7, wherein the inter dose correction model comprises a plurality of inter dose correction values of different dies of the first wafer.

9. The critical dimension uniformity (CDU) control method as claimed in claim 1, further comprising performing the second surface process to a second wafer, wherein the second wafer has a second CDU after the second surface process, and the second CDU is less than the first CDU.

10. The critical dimension uniformity (CDU) control method as claimed in claim 9, further comprising:
gathering the second CDU from the second wafer after being processed by the second surface process;
determining a second calibration process based on the second CDU;
calibrating the second surface process by the second calibration process to determine a third surface process different from the second surface process; and
performing the third surface process to a third wafer, wherein the third wafer has a third CDU after the third surface process, and the third CDU is less than the second CDU.

11. A critical dimension uniformity (CDU) control method, comprising:
performing a first surface process to a first wafer by a semiconductor substrate processing system, wherein the first wafer has a first CDU after the first surface process;
gathering the first CDU from the first wafer;
determining a first calibration process based on the first CDU, wherein the determining comprises:
an intra dose correction step for correcting reticle-dependent deviation;
a thru-slit dose sensitivity correction step for correcting time-dependent deviation; and
an inter dose correction step for correcting process-dependent deviation;
calibrating the first surface process by the first calibration process to determine a second surface process; and
performing the second surface process to a second wafer, wherein the second wafer has a second CDU after the second surface process, and the second CDU is less than the first CDU.

12. The critical dimension uniformity (CDU) control method as claimed in claim 11,
wherein the intra dose correction step comprises compensating the first CDU by an inter dose correction model, and the inter dose correction model comprises
a first inter dose correction sub-model used for controlling exposure dose; and
a second inter dose correction sub-model for controlling exposure time.

13. The critical dimension uniformity (CDU) control method as claimed in claim 11, wherein the thru-slit dose sensitivity correction step comprises:
scanning a die of the first wafer to get an initial profile;
analyzing the initial profile to get a simplified profile;
analyzing the simplified profile to determine a simplified correcting model; and
compensating the first CDU based on the simplified correcting model.

14. The critical dimension uniformity (CDU) control method as claimed in claim 13, wherein analyzing the simplified profile to determine the simplified correcting model comprises:
taking critical points from the initial profile; and
fitting the simplified profile by a regression curve based on a number of the critical points, wherein the regression curve acts as the simplified correcting model.

15. The critical dimension uniformity (CDU) control method as claimed in claim 14, wherein taking the critical points comprises:
differentiating the initial profile to get a differential function; and
determining the critical points from the differential function, wherein the critical points comprises a maximum point, a minimum point, zero points, and endpoints.

16. The critical dimension uniformity (CDU) control method as claimed in claim 14, wherein the regression curve is a polynomial, and the order of the regression curve is less than the number of the critical points.

17. The critical dimension uniformity (CDU) control method as claimed in claim 13, wherein compensating the first CDU based on the simplified correcting model comprises:
taking average of the initial profile to get an average intra CD;
determining a difference between the average intra CD and the regression curve; and
compensating the first CDU based on the difference.

18. The critical dimension uniformity (CDU) control method as claimed in claim 11, wherein the first wafer comprises a plurality of dies, and the inter dose correction step comprises:
determining average inter CD values of the dies of the first wafer;
determining a global CD value of the first wafer;
taking bias of the average inter CD values and the global CD, and then divided by a dose sensitivity to get an inter dose correction value of one of the dies; and
collecting the inter dose correction values of each dies to determine an inter dose correction model.

19. The critical dimension uniformity (CDU) control method as claimed in claim 18, wherein the inter dose correction step further comprises:
collecting inter CD arrays from different positions of the die of the first wafer; and
taking average of the collected inter CD arrays to get the average inter CD array.

20. A critical dimension uniformity (CDU) control method, comprising:
- gathering a CDU from a first wafer by a critical dimension scanning module;
- determining a first calibration process based on the first CDU, comprising:
  - an intra dose correction step for correcting reticle-dependent deviation, comprising compensating the first CDU by an inter dose correction model, and the inter dose correction model comprises a first inter dose correction sub-model used for controlling exposure dose, and a second inter dose correction sub-model for controlling exposure time;
  - a thru-slit dose sensitivity correction step for correcting time-dependent deviation; and
  - an inter dose correction step for correcting process-dependent deviation; and
- calibrating the first surface process by the first calibration process to determine a second surface process different from the first surface process.

* * * * *